United States Patent [19]

Koehler et al.

[11] Patent Number: 5,508,560
[45] Date of Patent: Apr. 16, 1996

[54] SEMICONDUCTOR MODULE

[75] Inventors: Werner Koehler, Warstein; Reinhold Spanke, Bestwig, both of Germany

[73] Assignee: Eupec Europaeische Gesellschaft Fuer Leistungs-Halbletter mbh & Co. KG, Warstein-Belecke, Germany

[21] Appl. No.: 336,319

[22] Filed: Nov. 8, 1994

[30] Foreign Application Priority Data

Nov. 8, 1993 [DE] Germany ............... 43 38 107.3

[51] Int. Cl.$^6$ ............... H01L 23/04; H01L 23/10; H01L 23/043; H01L 23/34
[52] U.S. Cl. ............... 257/730; 257/707; 257/709; 257/717
[58] Field of Search ............... 257/730, 709, 257/707, 706, 717, 699

[56] References Cited

FOREIGN PATENT DOCUMENTS

| 3917765 | 12/1990 | Germany. | |
|---|---|---|---|
| 3940933 | 6/1991 | Germany. | |
| 4233073 | 4/1994 | Germany. | |
| 2077143 | 3/1990 | Japan | 257/717 |

OTHER PUBLICATIONS

Patent Abstract of Japan No. JP 53–017072 (Takeshi et al), Apr. 17, 1978.

Patent Abstract of Japan No. JP 56–165329 (Tomohiko) Apr. 7, 1982.

Primary Examiner—Sara W. Crane
Assistant Examiner—Jhihan Clark
Attorney, Agent, or Firm—Herbert L. Lerner; Laurence A. Greenberg

[57] ABSTRACT

A semiconductor module includes a metal base plate having a plane upper surface and a convex lower surface. An electrically insulating and thermally conductive substrate is material-lockingly connected to the upper surface of the metal base plate. Semiconductor chips are material-lockingly connected to an upper surface of the substrate.

5 Claims, 1 Drawing Sheet

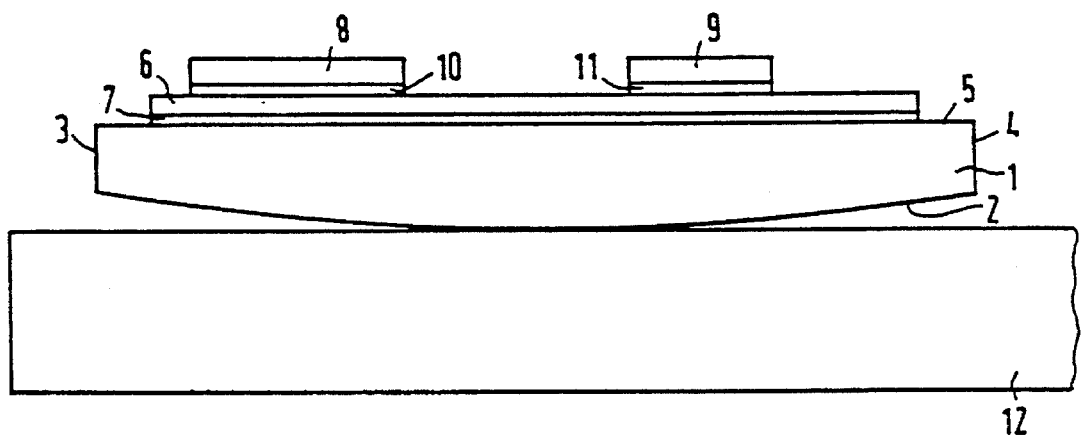

SEMICONDUCTOR MODULE

BACKGROUND OF THE INVENTION

Field of the Invention

The invention relates to a semiconductor module having an electrically insulating and thermally conductive substrate being connected in material-locking fashion to the top of a metal base plate, and semiconductor chips being connected in material-locking fashion to the top of the substrate, the underside of the base plate being constructed to be convex.

One such semiconductor module has been described in German Published, Non-Prosecuted Application DE 39 40 933 A1, for instance. The base plate therein is made convex, in order to enable satisfactory thermal contact between it and a cooling body during semiconductor module operation as well. The base plate, which is shaped to be convex with respect to the cooling body, is screwed on its ends to the cooling body. The base plate thus rests with its entire surface against the cooling body. The convex deformation is chosen to be so great that during operation the base plate does not arch upward in the middle.

In the module described in the aforementioned prior art, the base plate is of equal thickness over its entire surface. A convex deformation relative to the cooling body therefore causes a concave deformation on the top or upper surface. Since the substrate is joined to the base plate and the semiconductor chips are joined to the substrate usually by soft soldering, the molten solder has the tendency to flow away. That makes simple assembly of both the substrate and the semiconductor chips by simple solder preforming impossible. Thus the greater the convexity of the base plate and the more parts that have to be mounted on the base plate, the more difficult simple assembly becomes.

SUMMARY OF THE INVENTION

It is accordingly an object of the invention to provide a semiconductor module, which overcomes the hereinafore-mentioned disadvantages of the heretofore-known devices of this general type and which permits easy mounting with simple solder preforming, yet continues to assure satisfactory thermal contact between a base plate and a cooling body.

With the foregoing and other objects in view there is provided, in accordance with the invention, a semiconductor module, comprising a metal base plate having a plane upper surface and a convex lower surface; an electrically insulating and thermally conductive substrate being material-lockingly connected to the upper surface of the metal base plate, the substrate having an upper surface; and semiconductor chips being material-lockingly connected to the upper surface of the substrate.

In accordance with another feature of the invention, the lower surface of the base plate is convex in longitudinal and transverse directions.

In accordance with a further feature of the invention, the lower surface of the base plate is dome-shaped.

In accordance with an added feature of the invention, the semiconductor chips are soldered to the substrate.

In accordance with a concomitant feature of the invention, the substrate is soldered to the base plate.

Other features which are considered as characteristic for the invention are set forth in the appended claims.

Although the invention is illustrated and described herein as embodied in a semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The figure of the drawing is fragmentary, diagrammatic view of an exemplary embodiment of the invention, in which both a convex curvature of both an underside or lower surface of a base plate and a thickness of parts to be assembled have been shown in an exaggerated form for the sake of clarity.

DESCRIPTION OF THE PREFERRED EMBODIMENTS

Referring now to the single figure of the drawing in detail, there is seen a base plate indicated by reference numeral 1. The base plate is generally formed of a metal with good thermal conductivity, such as copper. The base plate has an underside or lower surface 2 that is convex with respect to a cooling body 12 and a plane or planar top or upper surface 5. A thermally highly conductive, electrically insulating substrate 6 is disposed on the top or upper surface 5. This substrate is typically formed of aluminum oxide $Al_2O_3$ or aluminum nitride AlN and is provided with solderable conductor tracks. The substrate 6 is joined to the top or upper surface 5 of the base plate 1 by a soft solder layer 7. Semiconductor chips 8, 9 are secured to the top or upper surface of the substrate 6 by soft solder layers 10, 11. These chips can then be connected to one another and to housing terminals by the conductor tracks. The tops or upper surfaces of the semiconductor chips 8, 9 are typically connected to one another and to the aforementioned conductor tracks by bond connections.

Since the surface 5 is plane, the assembly of the parts 6, 8 and 9 can be simplified greatly. In order to mount the substrate 6, a first solder preform is placed on top. A solder foil is then put in the form, and the substrate 6 is placed thereon. These parts are then heated in a continuous or once-through furnace. When the solder is heated, it remains between those parts because of the capillary action between the top or upper surface 5 and the substrate 6, so that these parts can be soldered together simply and in a reliably replicable manner. In a second pass, the semiconductor chips 8, 9 are placed in a second solder preform and then soldered to the top or upper surface of the substrate 6 in the continuous furnace. According to a practical feature, the solder used for soldering the semiconductor chips 8, 9 to the substrate 6 has a lower melting point than the solder of the solder layer 7.

Once the module is provided with leads, a housing and a housing filling, it is screwed to the cooling body 12 at ends 3, 4 of the base plate 1 by means of screws. In the process, the base plate 1 deforms until the underside or lower surface 2 rests in plane fashion. The top or upper surface 5 deforms in convex fashion. The mechanical forces that arise between the soldered parts are absorbed by the solder layers 7, 10 and 11.

If the base plate is considerably longer than it is wide, then a convex deformation of the underside or lower surface 2 in the longitudinal direction may suffice under some circumstances. In base plates having crosswise dimensions which are quite large and are approximately the same size as the lengthwise dimensions, a convex deformation in both directions is recommended. In that case, the underside or lower surface 2 may be given the shape of a dome.

In a practical exemplary embodiment, the base plate has a length of 137 mm and a width of 127 mm. The thickness of the base plate on the outside is 5 mm, and its greatest thickness in the middle is approximately 5.4 to 5.5 mm. Such a module is then secured to the cooling body, for instance by six screws.

We claim:

1. A semiconductor module, comprising:

a metal base plate having an upper surface and a lower surface;

an electrically insulating and thermally conductive substrate connected to said upper surface of said metal base plate, said substrate having an upper surface; and semiconductor chips disposed on and connected to said upper surface of said substrate;

said upper surface of said metal base plate being plane and said lower surface of said metal base plate being convex.

2. The semiconductor module according to claim 1, wherein said lower surface of said base plate is convex in longitudinal and transverse directions.

3. The semiconductor module according to claim 1, wherein said semiconductor chips are soldered to said substrate.

4. The semiconductor module according to claim 1, wherein said substrate is soldered to said base plate.

5. The semiconductor module according to claim 2, wherein said lower surface of said base plate is dome-shaped.

* * * * *